(12) United States Patent
Wang

(10) Patent No.: US 8,900,893 B2
(45) Date of Patent: Dec. 2, 2014

(54) VERTICAL LED CHIP PACKAGE ON TSV CARRIER

(75) Inventor: Chung Yu Wang, Hsin-Chu (TW)

(73) Assignee: TSMC Solid State Lighting Ltd., Hsin-Chu (TW)

(*) Notice: Subject to any disclaimer, the term of this patent is extended or adjusted under 35 U.S.C. 154(b) by 795 days.

(21) Appl. No.: 12/704,381

(22) Filed: Feb. 11, 2010

(65) Prior Publication Data

US 2011/0193056 A1 Aug. 11, 2011

(51) Int. Cl.
| | |
|---|---|
| *H01L 29/72* | (2006.01) |
| *H01L 33/62* | (2010.01) |
| *H01L 23/00* | (2006.01) |
| *H01L 33/00* | (2010.01) |
| *H01L 33/54* | (2010.01) |
| *H01L 23/48* | (2006.01) |

(52) U.S. Cl.
CPC ......... *H01L 33/62* (2013.01); *H01L 2924/0105* (2013.01); *H01L 2924/01015* (2013.01); *H01L 2224/49107* (2013.01); *H01L 2924/01075* (2013.01); *H01L 2224/83895* (2013.01); *H01L 2224/2919* (2013.01); *H01L 2924/01082* (2013.01); *H01L 2224/83385* (2013.01); *H01L 2224/83815* (2013.01); *H01L 24/29* (2013.01); *H01L 2224/94* (2013.01); *H01L 2924/01014* (2013.01); *H01L 2924/12041* (2013.01); *H01L 2224/48247* (2013.01); *H01L 2924/01013* (2013.01); *H01L 2224/45147* (2013.01); *H01L 33/0079* (2013.01); *H01L 2924/01079* (2013.01); *H01L 2224/73265* (2013.01); *H01L 2933/0066* (2013.01); *H01L 24/45* (2013.01); *H01L 2924/01049* (2013.01); *H01L 2924/01023* (2013.01); *H01L 2924/15311* (2013.01); *H01L 2224/45144* (2013.01); *H01L 2224/48091* (2013.01); *H01L 33/54* (2013.01); *H01L 2924/01033* (2013.01); *H01L 24/94* (2013.01); *H01L 2924/014* (2013.01); *H01L 23/481* (2013.01); *H01L 2224/32225* (2013.01); *H01L 2224/92247* (2013.01); *H01L 2224/48227* (2013.01); *H01L 24/32* (2013.01); *H01L 2924/01029* (2013.01); *H01L 2224/291* (2013.01)
USPC .............................................. 438/26; 438/27

(58) Field of Classification Search
CPC ...................................................... H01L 33/62
USPC ....................................................... 438/26, 27
See application file for complete search history.

(56) References Cited

U.S. PATENT DOCUMENTS

| | | | |
|---|---|---|---|
| 7,776,637 B2* | 8/2010 | Leem ............................... | 438/46 |
| 2004/0188696 A1 | 9/2004 | Hsing Chen et al. | |
| 2006/0278885 A1 | 12/2006 | Tain et al. | |
| 2006/0281203 A1* | 12/2006 | Epler et al. ...................... | 438/22 |
| 2009/0278162 A1* | 11/2009 | Wang et al. ..................... | 257/99 |
| 2010/0117096 A1* | 5/2010 | Yoo et al. ........................ | 257/76 |

FOREIGN PATENT DOCUMENTS

| | | |
|---|---|---|
| CN | 1925182 | 3/2007 |
| CN | 1998065 | 7/2007 |
| CN | 101194373 | 6/2008 |

* cited by examiner

*Primary Examiner* — Edward Wojciechowicz
(74) *Attorney, Agent, or Firm* — Haynes and Boone, LLP

(57) ABSTRACT

A method of forming a light-emitting device (LED) package component includes providing a substrate; forming an LED on the substrate; and lifting the LED off the substrate. A carrier wafer is provided, which includes a through-substrate via (TSV) configured to electrically connecting features on opposite sides of the carrier wafer. The LED is bonded onto the carrier wafer, with the LED electrically connected to the TSV.

20 Claims, 6 Drawing Sheets

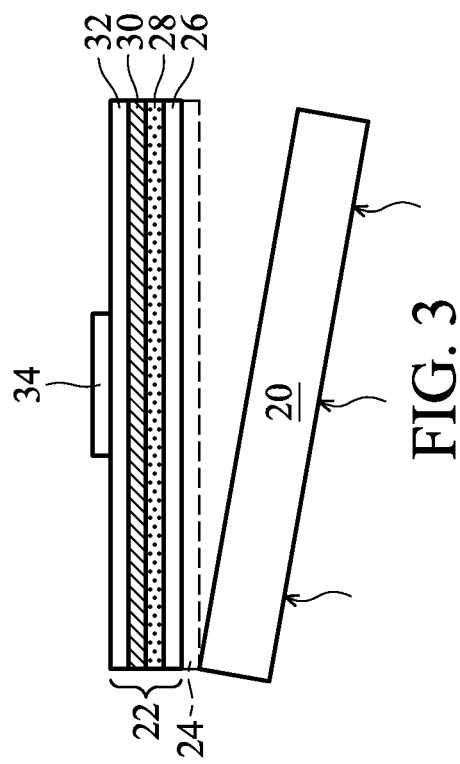
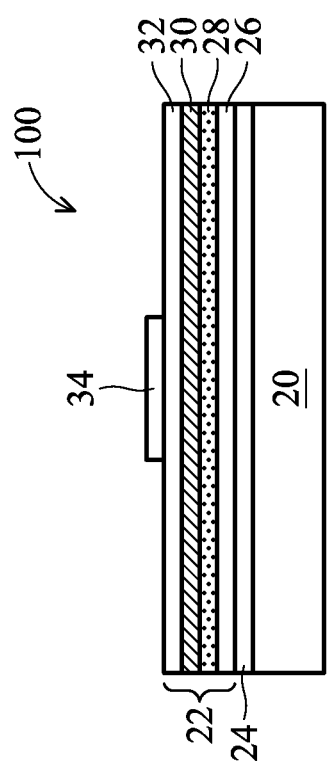

VERTICAL LED CHIP PACKAGE ON TSV CARRIER

TECHNICAL FIELD

This disclosure relates generally to light-emitting device (LED) package components, and more particularly to vertical LED packages including through-substrate vias (TSVs).

BACKGROUND

In recent years, optical devices, such as light emitting diodes (LEDs), laser diodes, and UV photo-detectors have increasingly been used. Group-III nitride compounds, such as gallium nitride (GaN) and its related alloys have been known suitable for the formation of the optical devices. The large bandgap and high electron saturation velocity of the group-III nitride compounds also make them excellent candidates for applications in high-temperature and high-speed power electronics.

Due to the high equilibrium pressure of nitrogen at typical growth temperatures, it is extremely difficult to obtain GaN bulk crystals. Therefore, GaN layers and the respective LEDs are often formed on other substrates that match the characteristics of GaN. Sapphire ($Al_2O_3$) is a commonly used substrate material. FIG. 1 illustrates a cross-sectional view of a package component including LED 2. LED 2, which includes a plurality of GaN-based layers, is formed on sapphire substrate 4. Sapphire substrate 4 is further mounted on lead frame 6. LED 2 further includes electrodes 8 and 10 electrically connected to lead frame 6 through gold wires 12.

Because sapphire has a low thermal conductivity, heat generated by LED 2 cannot be dissipated through sapphire substrate 4 efficiently. The heat needs to be dissipated through the top end of LED 2, and through gold wires 12. However, since gold wires 12 are relatively long since they have to extend to lead frame 6, the thermal conductivity through gold wires 12 is also low. In addition, electrodes 8 and 10 occupy chip area, and hence the LED light output area is not optimized.

SUMMARY

In accordance with one aspect, a method of forming a light-emitting device (LED) package component is provided, including forming an LED on a substrate; and lifting the LED off the substrate. A carrier wafer is provided that includes a through-substrate via (TSV) configured to electrically connect features on opposite sides of the carrier wafer. The LED is bonded onto the carrier wafer, with the LED electrically connected to the TSV.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2 through 7 are cross-sectional views of intermediate stages in the manufacturing of a package component including at least one LED chip in accordance with various embodiments.

DETAILED DESCRIPTION OF ILLUSTRATIVE EMBODIMENTS

Figure 1:
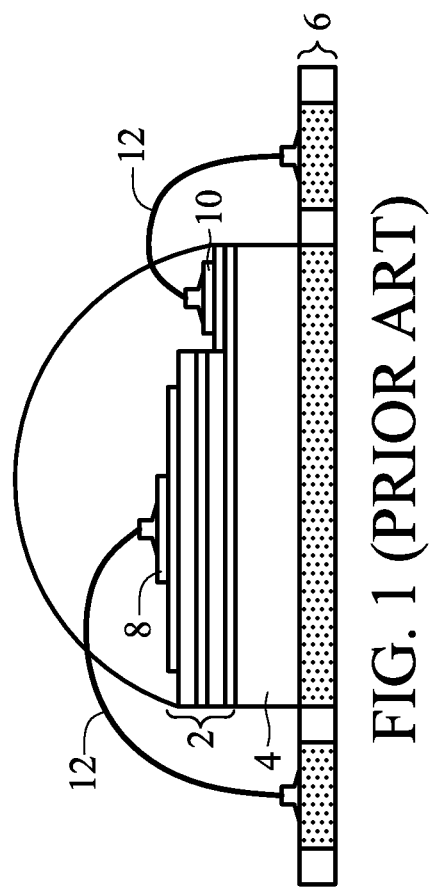
FIG. 1 illustrates a cross-sectional view of a conventional light-emitting device (LED) package structure formed on a sapphire substrate.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel light-emitting device (LED) package component and the method of forming the same are presented. The intermediate stages of manufacturing an embodiment are illustrated. The variations of the embodiment are then discussed. Throughout the various views and illustrative embodiments, like reference numbers are used to designate like elements.

FIG. 2 illustrates wafer 100, which includes LED 22 formed on substrate 20. In an embodiment, substrate 20 is formed of sapphire ($Al_2O_3$), although it may also be formed of other materials having characteristics close to the characteristics of the LED formed thereon (which may comprise group-III and group-V elements, or also known as III-V compound semiconductor materials).

Un-doped gallium nitride (u-GaN) layer 24 or another heat sensitive material is formed above, and possibly contacts, substrate 20. In an embodiment, u-GaN layer 24 is substantially free from elements other than Ga and N. LED 22 is formed on top of, and may possibly contact, u-GaN layer 24. LED 22 may include a plurality of layers. Accordingly to various embodiments, LED 22 includes at least one multiple quantum well (MQW), a first group-III nitride (III-nitride) layer doped with a first impurity of a first conductivity type under the MQW, and a second III-nitride layer doped with a second impurity of a second conductivity type opposite the first conductivity type over the MQW. The group-III nitride layers are each connected to a TSV in the carrier wafer.

In an exemplary embodiment, LED 22 includes n-GaN layer (GaN doped with an n-type impurity) 26, multiple quantum well (MQW) 28, p-GaN layer (GaN doped with a p-type impurity) 30, reflector 32, and top electrode 34. Reflector 32 may be formed of an indium tin oxide (ITO), for example. MQW 28 may be formed of, for example, InGaN, and acts as an active layer for emitting light. The formations of layers 26, 28, 30, 32, and 34 are known in the art, and hence are not disclosed in detail herein. In an exemplary embodiment, the formation methods of layers 26, 28, 30, and 32 may include epitaxial growth. It is realized that LED 22 may have many designs, and FIG. 2 only shows an exemplary version among the available variations. For example, the materials of each of the layers 26, 28, 30, and 32 may be different from the above-discussed material, and may be ternary III-V compound semiconductor materials. Also, the positions of n-GaN layer 26 and p-GaN layer 30 may be swapped.

LED 22 as shown in FIG. 2 may represent a plurality of LEDs, each comprising one electrode 34, although only one LED 22 is illustrated. Referring to FIG. 3, LED(s) 22 are lifted off substrate 20. In an exemplary embodiment, substrate 20 is exposed to light energy, for example, a laser beam (symbolized by arrows), projecting from the bottom of substrate 20. The laser beam penetrates through substrate 20 to layer 24. As a result, layer 24 is decomposed by the heat resulting from the laser beam, and hence LED(s) 22 are separated from substrate 20. In an embodiment, the laser is a KrF laser with a wavelength of about 248 nm. After the lift-off, LEDs 22 are separated from each other, with each of LEDs 22 including one electrode 34.

Figure 4A:
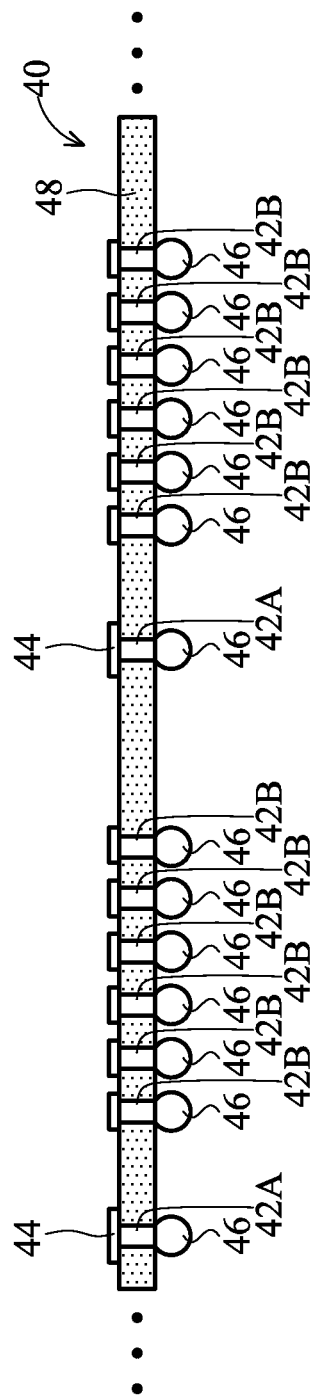

Referring to FIG. 4A, carrier wafer 40 is provided. Carrier wafer 40 may comprise substrate 48, which may be a semiconductor substrate, such as a silicon substrate, or may be a dielectric substrate. Through-substrate vias (TSVs) 42 (denoted as 42A and 42B) are formed in substrate 48 and electrically connect features on opposite sides of carrier wafer 40. TSVs 42 may comprise copper or other metals, such as tungsten, or alloys thereof. Solder balls 46 may be mounted on one side of substrate 48 and on TSVs 42. On each side of carrier wafer 40, filled TSVs 42 may protrude out of the surface slightly. Alternatively, bond pads (such as bond pads 44) may be formed on filled TSVs 42.

Figure 4B:
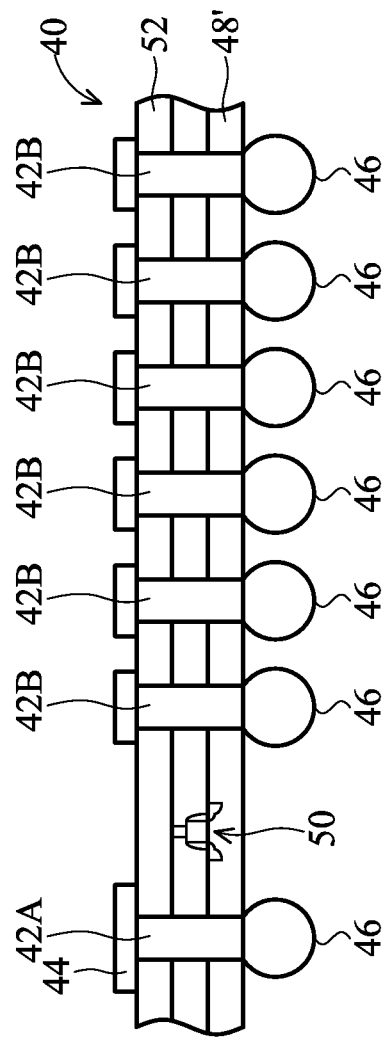

In various embodiments, carrier wafer 40 includes active circuits therein, as is schematically illustrated in FIG. 4B. In these embodiments, carrier wafer 40 may comprise a semiconductor substrate, such as a silicon substrate (denoted as 48'). Accordingly, TSVs 42 may be through-silicon vias. An exemplary active circuit (symbolized by an MOS device) 50 is schematically shown as being formed at the surface of semiconductor substrate 48'. Active circuit 50 may include CMOS devices (PMOS devices and NMOS devices), capacitors, diodes, or the like. Active circuit 50 may also include desirable CMOS circuits such as electro-static discharge (ESD) circuits/devices, which may be used to protect the optical devices mounted thereon, and/or driver circuits, for example, for driving the LEDs bonded on carrier wafer 40. Inter-metal dielectric (IMD) layers 52 may be formed over active circuit 50. Metal lines and vias (not shown) may be formed in IMD layers 52 to interconnect the devices in active circuit 50. In alternative embodiments, no active circuit is formed in carrier wafer 40.

Figure 5:
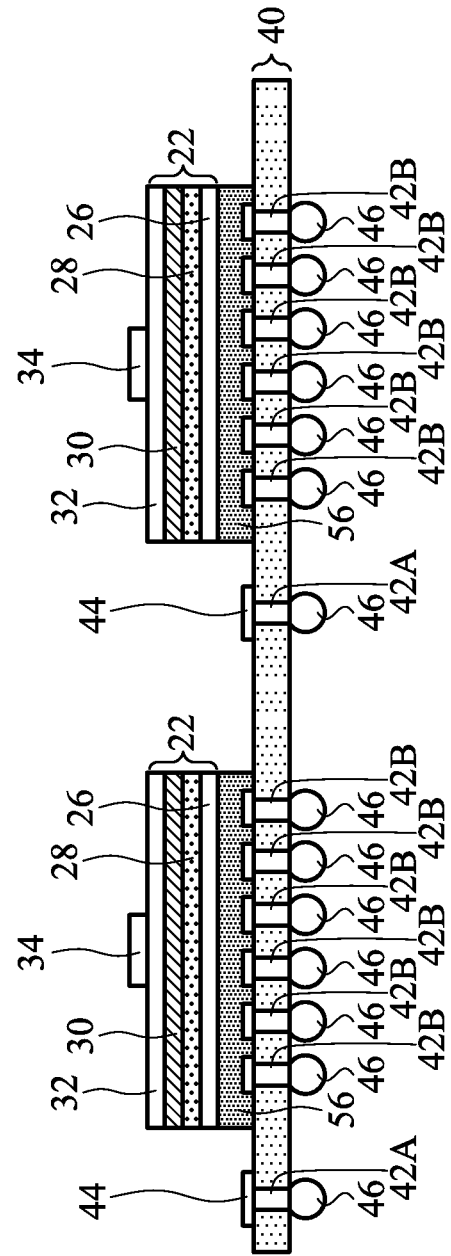

Referring to FIG. 5, a plurality of LEDs 22 is bonded onto carrier wafer 40. The adhesion of LEDs 22 to carrier wafer 40 may be achieved through conductive thermal interface material (TIM) layer 56. In an embodiment, each of conductive TIM layers 56 has a similar size as that of LED 22. In alternative embodiments, conductive TIM layer 56 includes a plurality of discrete components, each corresponding to one of TSVs 42B and/or the bond pad formed thereon. Conductive TIM layers 56 may be formed of solder, metals, conductive organic materials, or the like, providing the materials have electrical and thermal conductivities suitable for LED operation. The bonding between LEDs 22 onto carrier wafer 40 may be performed through the reflow of the solder or through direct metal-to-metal bonding, depending on the materials of conductive TIM layers 56.

With LEDs 22 being bonded onto carrier wafer 40, n-GaN layers 26 in LEDs 22 are electrically connected to TSVs 42B and solder balls 46 through respective conductive TIM layers 56. Accordingly, solder balls 46 may be used to conduct a voltage to LEDs 22. Further, the heat generated in LED 22 may be conducted to carrier wafer 40 through the respective conductive TIM layers 56.

Figure 6:
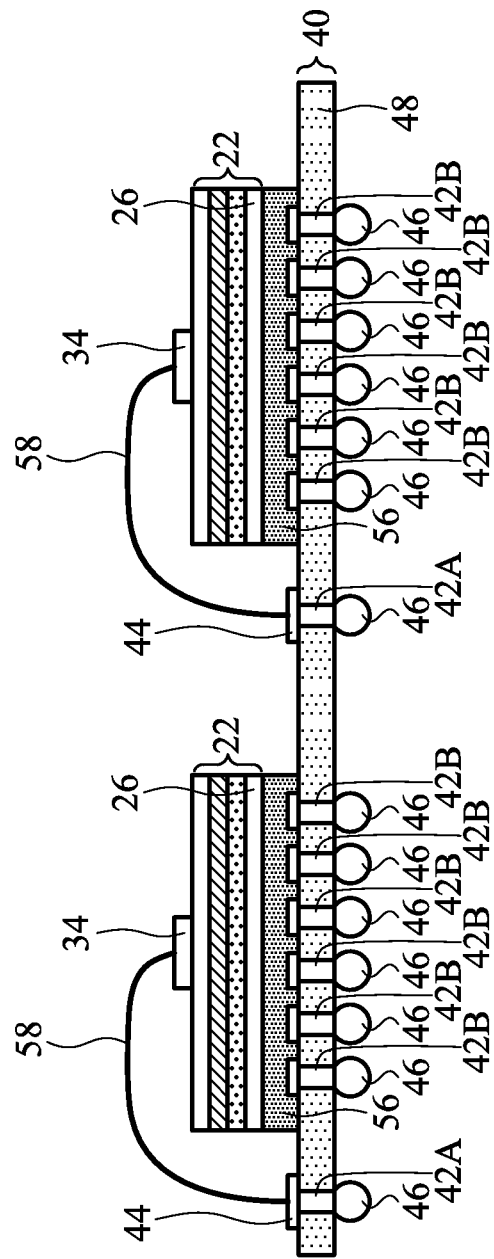
Figure 7:
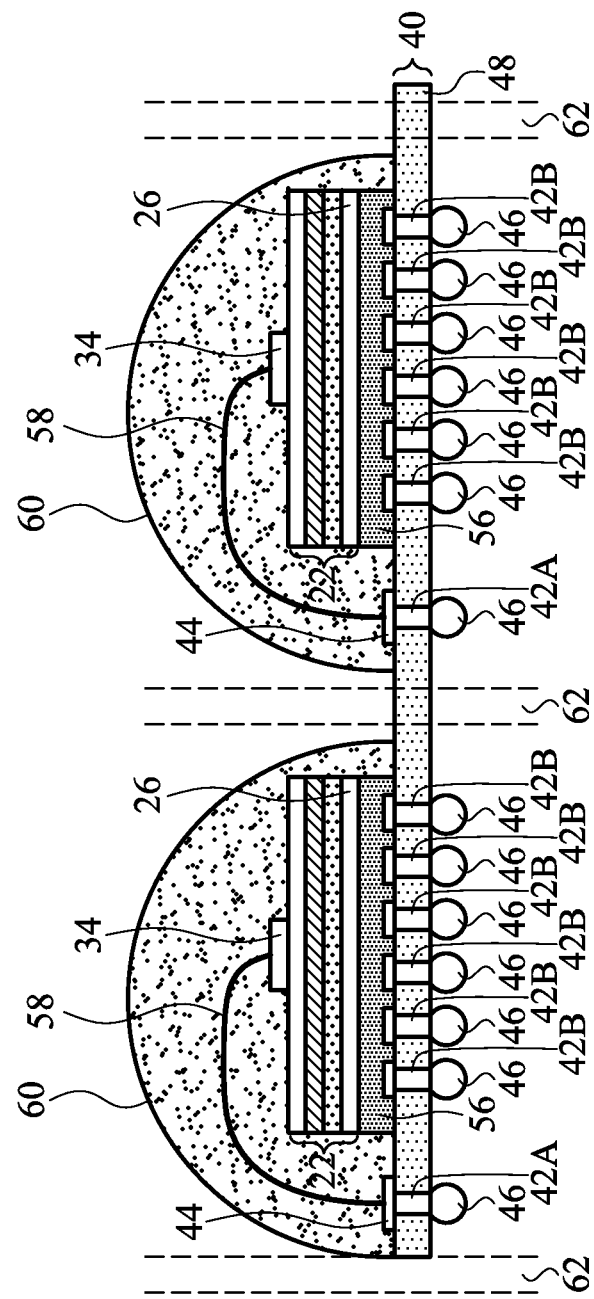

FIG. 6 illustrates the wire-bonding of electrodes 34 to bond pads 44, wherein conductive wires 58 are used to electrically connect electrodes 34 to TSVs 42A. Conductive wires 58 may be gold wires or copper wires although they may also be formed of other metallic materials. Referring to FIG. 7, silicone lenses 60 are molded onto LEDs 22. The molding of silicone lenses 60 is known in the art, and hence is not disclosed in detail herein. Each of silicone lenses 60 may cover the respective LEDs 22 and wires 58.

Carrier wafer 40 may then be diced or sawed along scribe lines 62, so that LED package components are separated individually. Blades or laser may be used to dice or saw the carrier wafer. Accordingly, carrier wafer 40 is separated into a plurality of carrier chips, with each being bonded to one of LEDs 22. It is noted that in the above-discussed embodiments, the bonding of LEDs 22 and the wire bonding are performed at wafer level before carrier wafer 40 is diced or sawed. In alternative embodiments, the bonding of LEDs 22 and the wire bonding are performed at chip level after carrier wafer 40 is diced. In these alternative embodiments, one LED 22 is bonded onto a carrier chip that has already been sawed from carrier wafer 40.

As shown in FIG. 7, the electrical connection to the bottom of LED 22 is made through TSVs 42B. Accordingly, the LED light output area is increased since the connection to n-GaN layer 26 no longer requires additional chip area. Further, carrier wafer 40 has significantly higher thermal conductivity than a sapphire substrate, partially due to the conductive TIM layers 56, silicon (in substrate 48), and the plurality of TSVs 42B (which may be formed of copper) all having higher thermal conductivities than sapphire. The thermal conductivity of carrier wafer 40 may be ten times higher than that of a sapphire substrate or even higher. The electrical conductivity to LED 22 may also be improved by using a plurality of TSVs 42B.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a light-emitting device (LED) package component, the method comprising:
   providing a substrate;
   epi-growing an LED on the substrate, wherein the epi-growing the LED on the substrate is performed so that a first side of the LED faces the substrate;
   lifting the LED off the substrate;
   providing a carrier wafer comprising a first through-substrate via (TSV) configured to electrically connect features on opposite sides of the carrier wafer; and
   bonding, after the LED has been lifted off the substrate, the LED onto the carrier wafer, with the LED electrically connected to the first TSV, wherein the bonding the LED onto the carrier wafer is performed so that the LED is bonded to the carrier wafer through the first side of the LED.

2. The method of claim 1, wherein the step of lifting the LED off the substrate comprises using a laser beam to decompose an intermediate layer between the substrate and the LED.

3. The method of claim 2, wherein the intermediate layer comprises undoped GaN.

4. The method of claim 3, wherein the substrate is a sapphire substrate, and wherein the epi-growing the LED comprises:

epi-growing the intermediate layer on the sapphire substrate, the intermediate layer being in physical contact with the sapphire substrate; and epi-growing the LED on the undoped gallium nitride layer, the LED being in physical contact with the intermediate layer.

5. The method of claim 1, wherein the LED comprises:
a multiple quantum well (MQW);
a first group-III nitride (III-nitride) layer doped with a first impurity of a first conductivity type under the MQW, wherein the first TSV is electrically connected to the first III-nitride layer; and
a second III-nitride layer doped with a second impurity of a second conductivity type opposite the first conductivity type over the MQW.

6. The method of claim 5, wherein the first conductivity type is n-type, and the second conductivity type is p-type.

7. The method of claim 5 further comprising performing a wire bonding to electrically connect the second III-nitride layer to a second TSV in the carrier wafer.

8. The method of claim 1 further comprising dicing the carrier wafer.

9. The method of claim 1, where in the step of bonding the LED onto the carrier wafer comprises applying a thermal interface material between the LED and the carrier wafer.

10. A method of forming a light-emitting device (LED) package component, the method comprising:
providing a sapphire substrate;
epi-growing a plurality of LEDs on the sapphire substrate, each LED containing a light-emitting layer, a first doped layer having a first type of conductivity, and a second doped layer having a second type of conductivity different from the first type of conductivity, wherein the forming the plurality of LEDs is performed such that the first doped layer is located closer to the sapphire substrate than the second doped layer;
projecting a laser on the sapphire substrate to separate the plurality of LEDs from the sapphire substrate;
bonding, after the plurality of LEDs have been separated from the sapphire substrate, the plurality of LEDs onto a first plurality of through-substrate vias (TSVs) in a carrier wafer, wherein the bonding the plurality of LEDs is performed such that the first doped layer is located closer to the carrier wafer than the second doped layer after the bonding; and
performing a wire bonding to connect a top electrode in each of the plurality of LEDs to one of a second plurality of TSVs in the carrier wafer.

11. The method of claim 10, wherein the step of bonding the plurality of LEDs onto the first plurality of TSVs comprises bonding a conductive thermal interface material between, and contacting, a III-nitride layer and at least one of the first plurality of TSVs.

12. The method of claim 10, wherein each of the plurality of LEDs is bonded to more than one of the first plurality of TSVs without using bond wires.

13. The method of claim 10 further comprising molding a plurality of silicon lens on each of the plurality of LEDs.

14. The method of claim 1, wherein the carrier wafer contains an active circuit.

15. The method of claim 10, wherein the carrier wafer contains an active circuit and an inter-metal dielectric (IMD) layer.

16. A method, comprising:
growing a light-emitting diode (LED) on a first substrate through an epitaxial growth process;
removing the first substrate from the LED; and
thereafter bonding the LED to a second substrate, the second substrate containing a via that extend through the second substrate;
wherein the bonding is performed such that:
the LED is electrically coupled to the via; and
a side of the LED from which the first substrate is removed is bonded to the second substrate.

17. The method of claim 16, further comprising: forming an electrode contact on the LED; and wherein:
the LED contains a first layer with a first type conductivity and a second layer with a second type conductivity opposite the first type;
the forming the electrode contact is performed such that the electrode contact is electrically coupled to the first layer of the LED; and
the bonding the LED is performed such that the via is electrically coupled to the second layer of the LED.

18. The method of claim 16, wherein the second substrate contains one or more active circuits and an inter-metal dielectric (IMD) layer.

19. The method of claim 5, wherein the bonding is performed such that the first TSV is electrically coupled to the first III-nitride layer without bond wires.

20. The method of claim 17, wherein:
the electrode contact is electrically coupled to the first layer of the LED through a bond wire; and
the via is electrically coupled to the second layer of the LED without any bond wires.

* * * * *